(12) United States Patent
Jayakumar

(10) Patent No.: US 12,166,494 B2
(45) Date of Patent: Dec. 10, 2024

(54) MODIFIED CONTROL LOOP IN A DIGITAL PHASE-LOCKED LOOP

(71) Applicant: Skyworks Solutions, Inc., Irvine, CA (US)

(72) Inventor: Kannanthodath V. Jayakumar, Austin, TX (US)

(*) Notice: Subject to any disclaimer, the term of this patent is extended or adjusted under 35 U.S.C. 154(b) by 44 days.

(21) Appl. No.: 18/086,463

(22) Filed: Dec. 21, 2022

(65) Prior Publication Data

US 2023/0198531 A1 Jun. 22, 2023

Related U.S. Application Data

(60) Provisional application No. 63/292,515, filed on Dec. 22, 2021.

(51) Int. Cl.
| | |
|---|---|
| *H03L 7/10* | (2006.01) |
| *H03L 7/093* | (2006.01) |
| *H03L 7/099* | (2006.01) |
| *H03L 7/107* | (2006.01) |
| *H03L 7/22* | (2006.01) |

(52) U.S. Cl.
CPC ............ *H03L 7/104* (2013.01); *H03L 7/093* (2013.01); *H03L 7/0991* (2013.01); *H03L 7/1075* (2013.01); *H03L 7/22* (2013.01); *H03L 2207/50* (2013.01)

(58) Field of Classification Search
CPC ... H03L 7/093; H03L 2207/50; H03L 7/1075; H03L 7/107; H03L 7/104; H03L 7/0991
See application file for complete search history.

(56) References Cited

U.S. PATENT DOCUMENTS

| | | | |
|---|---|---|---|
| 6,147,561 | A | 11/2000 | Rhee et al. |
| 6,630,868 | B2 | 10/2003 | Perrott et al. |
| 6,707,342 | B1 | 3/2004 | Zachan et al. |
| 6,717,475 | B2 | 4/2004 | McCarthy |
| 6,765,445 | B2 | 7/2004 | Perrott et al. |
| 6,785,346 | B1 | 8/2004 | Birkett et al. |
| 6,792,282 | B1 | 9/2004 | Domino et al. |
| 6,801,784 | B1 | 10/2004 | Rozenblit et al. |
| 6,867,655 | B2 | 3/2005 | McCarthy |
| 6,920,622 | B1 | 7/2005 | Garlepp et al. |
| 6,927,637 | B1 | 8/2005 | Koh et al. |
| 6,961,547 | B2 | 11/2005 | Rozenblit et al. |
| 7,064,617 | B2 | 6/2006 | Hein et al. |
| 7,068,110 | B2 | 6/2006 | Frey et al. |

(Continued)

*Primary Examiner* — Ryan Johnson
(74) *Attorney, Agent, or Firm* — Knobbe, Martens, Olson & Bear, LLP

(57) ABSTRACT

A method for generating a clock signal using a digital phase-locked loop includes updating a gain of a variable gain digital filter of the digital phase-locked loop using an estimate error of a current estimate of a phase and a frequency of an input clock signal and a measurement error of a measurement of the phase and the frequency of the input clock signal. The gain may include a proportional gain component and an integral gain component. The method may include calculating the current estimate of the phase and the frequency of the input clock signal based on a previous estimate of the phase and the frequency of the input clock signal, the measurement of the phase and the frequency of the input clock signal, and the gain of the variable gain digital filter. The gain may be updated every cycle of the input clock signal.

19 Claims, 10 Drawing Sheets

(56) References Cited

U.S. PATENT DOCUMENTS

| | | |
|---|---|---|
| 7,079,598 B2 | 7/2006 | Birkett et al. |
| 7,091,759 B2 | 8/2006 | Sowiati et al. |
| 7,099,636 B2 | 8/2006 | Rozenblit et al. |
| 7,138,839 B2 | 11/2006 | Zachan et al. |
| 7,148,753 B1 | 12/2006 | Garlepp et al. |
| 7,187,241 B2 | 3/2007 | Hein et al. |
| 7,218,951 B2 | 5/2007 | Rozenblit et al. |
| 7,256,629 B2 | 8/2007 | Zachan et al. |
| 7,288,998 B2 | 10/2007 | Thomsen et al. |
| 7,295,077 B2 | 11/2007 | Thomsen et al. |
| 7,355,463 B2 | 4/2008 | Sowiati et al. |
| 7,375,591 B2 | 5/2008 | Fu et al. |
| 7,405,628 B2 | 7/2008 | Hulfachor et al. |
| 7,436,227 B2 | 10/2008 | Thomsen et al. |
| 7,443,250 B2 | 10/2008 | Seethamraju et al. |
| 7,576,614 B2 | 8/2009 | Zachan et al. |
| 7,612,617 B2 | 11/2009 | Pullela et al. |
| 7,613,267 B2 | 11/2009 | Perrott et al. |
| 7,706,496 B2 | 4/2010 | Youssoufian |
| 7,747,237 B2 | 6/2010 | All et al. |
| 7,825,708 B2 | 11/2010 | Thomsen et al. |
| 7,834,706 B2 | 11/2010 | Frey et al. |
| 7,869,780 B2 | 1/2011 | Youssoufian et al. |
| 8,135,365 B2 | 3/2012 | Youssoufian et al. |
| 8,154,351 B2 | 4/2012 | Tadjpour |
| 8,193,867 B2 | 6/2012 | Fu et al. |
| 8,456,206 B2 | 6/2013 | Namdar-Mehdiabadi et al. |
| 8,532,243 B2 | 9/2013 | Seethamraju et al. |
| 8,554,156 B2 | 10/2013 | Tadjpour |
| 8,791,734 B1 | 7/2014 | Hara et al. |
| 8,989,332 B2 | 3/2015 | Katumba et al. |
| 8,994,420 B2 | 3/2015 | Eldredge et al. |
| 9,036,762 B2 | 5/2015 | Green |
| 9,042,854 B2 | 5/2015 | Wang et al. |
| 9,054,716 B2 | 6/2015 | Obkircher et al. |
| 9,065,457 B2 | 6/2015 | Namdar-Mehdiabadi et al. |
| 9,236,851 B2 | 1/2016 | Youssoufian et al. |
| 9,246,500 B2 | 1/2016 | Perrott |
| 9,270,288 B2 | 2/2016 | Perrott |
| 9,350,367 B2 | 5/2016 | All et al. |
| 9,362,925 B2 | 6/2016 | Namdar-Mehdiabadi et al. |
| 9,461,653 B2 | 10/2016 | Perrott |
| 9,490,818 B2 | 11/2016 | Perrott |
| 9,490,827 B2 | 11/2016 | Wang et al. |
| 9,531,392 B2 | 12/2016 | Katumba et al. |
| 9,705,521 B1 | 7/2017 | Monk et al. |
| 9,762,250 B2 | 9/2017 | Perroti |
| 9,768,790 B2 | 9/2017 | Namdar-mehdiabadi |
| 10,075,173 B2 | 9/2018 | Sarda |
| 10,263,626 B2 | 4/2019 | Wang et al. |
| 10,608,649 B1 | 3/2020 | Jayakumar et al. |
| 10,651,862 B1 | 5/2020 | Barette et al. |
| 10,727,844 B1 | 7/2020 | Gong et al. |
| 10,819,353 B1 | 10/2020 | Monk et al. |
| 10,819,354 B2 | 10/2020 | Jayakumar et al. |
| 10,826,507 B1 | 11/2020 | Gong et al. |
| 10,833,682 B1 | 11/2020 | Monk et al. |
| 10,908,635 B1 | 2/2021 | Ranganathan et al. |
| 11,018,679 B1 | 5/2021 | Jayakumar |
| 11,088,819 B1 | 8/2021 | Sarda |
| 11,095,295 B2 | 8/2021 | Monk et al. |
| 11,228,403 B2 | 1/2022 | Ranganathan et al. |
| 11,283,459 B1 | 3/2022 | Monk et al. |
| 11,502,764 B2 | 11/2022 | Sarda |
| 11,563,441 B2 | 1/2023 | Monk et al. |
| 11,671,238 B2 | 6/2023 | Sarda |
| 2007/0036253 A1* | 2/2007 | Seo .................. H03L 7/093 |
| | | 375/354 |
| 2007/0132518 A1* | 6/2007 | Wang .................. H03L 7/093 |
| | | 331/17 |
| 2007/0146083 A1 | 6/2007 | Hein et al. |
| 2014/0035641 A1* | 2/2014 | Lamanna ............ H03L 7/1075 |
| | | 327/159 |
| 2014/0062549 A1* | 3/2014 | Navid .................. G11C 7/222 |
| | | 327/156 |
| 2022/0077863 A1 | 3/2022 | Monk et al. |
| 2022/0123877 A1 | 4/2022 | Ranganathan et al. |
| 2023/0094645 A1 | 3/2023 | Jayakumar |
| 2023/0188237 A1 | 6/2023 | Sarda |
| 2023/0198531 A1 | 6/2023 | Jayakumar |
| 2023/0231567 A1 | 7/2023 | Monk et al. |
| 2024/0056084 A1* | 2/2024 | Lee .................... H03L 7/093 |

\* cited by examiner

MODIFIED CONTROL LOOP IN A DIGITAL PHASE-LOCKED LOOP

CROSS-REFERENCE TO RELATED APPLICATION(S)

Any and all applications for which a foreign or domestic priority claim is identified in the Application Data Sheet as filed with the present application are hereby incorporated by reference under 37 CFR 1.57.

BACKGROUND

Field of the Invention

This invention relates to generating clock signals for electronic devices and more particularly to generating clock signals using digital phase-locked loops.

Description of the Related Art

A conventional digital phase-locked loop control system that includes a Proportional Integral (PI) controller has a lock time that is defined by the required loop bandwidth, quality of the input clock signal, peaking requirement, etc. The lock time of the conventional digital phase-locked loop is negligible for relatively high frequency input clock signals but becomes increasingly significant as the frequency of the input clock signal decreases. In applications that use an input clock signal having a relatively low frequency, such as a Global Positioning System (GPS) or distributed timing application that receives a Pulse Per Second (PPS) input clock signal (i.e., a 1 Hz input clock signal) or a Pulse Per Two Second (PP2S) input clock signal (i.e., an 0.5 Hz input clock signal), the conventional digital phase-locked loop takes a relatively long time (e.g., approximately an hour) to lock. The relatively long locking time can degrade further according to the quality of the input clock signal. However, a target application specification requires locking time to be less than one minute. The relatively long lock time for a low frequency input clock signal impacts performance in systems that relock the digital phase-locked loop when the input clock signal is lost and recovered or switched. Accordingly, improved digital phase-locked loop techniques are desired.

SUMMARY OF EMBODIMENTS OF THE INVENTION

In at least one embodiment, a method for generating a clock signal using a digital phase-locked loop includes updating a gain of a variable gain digital filter of the digital phase-locked loop using an estimate error of a current estimate of a phase and a frequency of an input clock signal and a measurement error of a measurement of the phase and the frequency of the input clock signal. The gain may include a proportional gain component and an integral gain component. The method may include calculating the current estimate of the phase and the frequency of the input clock signal based on a previous estimate of the phase and the frequency of the input clock signal, the measurement of the phase and the frequency of the input clock signal, and the gain of the variable gain digital filter. The gain may be updated every cycle of the input clock signal.

In at least one embodiment, a digital phase-locked loop includes a time-to-digital converter configured to generate a digital signal based on an input clock signal. The digital phase-locked loop is configured to generate a phase-adjusted clock signal based on the digital signal. The digital phase-locked loop includes a variable gain digital filter configured to apply a time-varying gain to the digital signal. The digital phase-locked loop includes a variable gain generator configured to use the digital signal to update the time-varying gain based on an estimate error of a current estimate of a phase and a frequency of the input clock signal and a measurement error of a measurement of the phase and the frequency of the input clock signal. The variable gain digital filter may include a proportional signal path and an integral signal path and the time-varying gain may include a proportional gain component and an integral gain component.

In at least one embodiment, a method for generating a clock signal using a digital phase-locked loop includes filtering a state of a phase and a frequency of an input clock signal using a variable gain digital filter having a gain updated based on an estimate of the phase and the frequency of the input clock signal and a measurement of the phase and the frequency of the input clock signal. The gain may include a proportional gain component and an integral gain component. The gain may be updated every cycle of the input clock signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
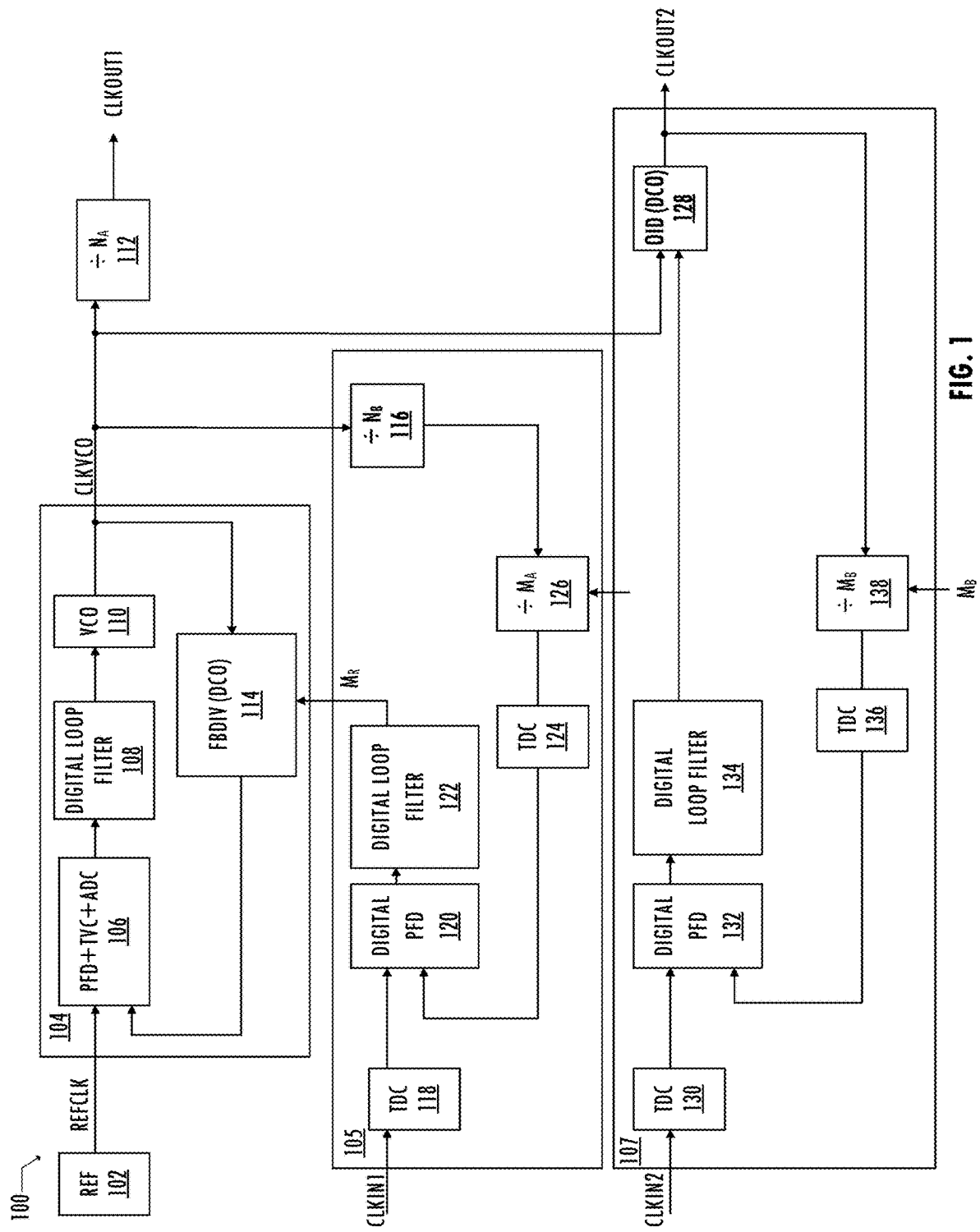
FIG. 1 illustrates a functional block diagram of an exemplary digital phase-locked loop.

FIG. 1 illustrates an embodiment of a digital phase-locked loop that is used in high performance output clock generation systems to generate various output clock signals that satisfy timing requirements of a target application. Clock integrated circuit 100 includes a multi-loop, digital phase-locked loop that generates clock signal CLKVCO having low jitter by tracking clock signal CLKIN1. In at least one embodiment, local reference clock signal REFCLK, provided by reference clock source 102, stabilizes clock signal CLKVCO in the absence of clock signal CLKIN1. Digital phase-locked loop 104 is an inner phase-locked loop that includes combination circuit 106 (including phase/frequency detector, a time-to-voltage converter and an analog-to-digital converter), loop filter 108, and voltage-controlled oscillator 110. Voltage controlled oscillator 110 may be implemented as a ring oscillator, an LC oscillator, or other suitable oscillator structure. Circuit 106 receives the clock signal from reference clock source 102, which includes a fixed source such as a crystal oscillator, an oven-controlled crystal oscillator, a microelectromechanical structure (MEMS) oscillator, or other suitable low-jitter source. In at least one embodiment, digital phase-locked loop 104 is coupled to an inner-most phase-locked loop (not shown) that locks to a local crystal oscillator.

Digital phase-locked loop 105 is an outer digital phase-locked loop that includes time-to-digital converter 118, phase/frequency detector 120, digital loop filter 122, frequency divider 126 (e.g., a fractional divider), and uses digital phase-locked loop 104 as a digitally controlled oscillator for phase-locked loop 105. The digitally controlled oscillator is responsive to divider value MR, which may be a fractional divide value provided by digital loop filter 122. Phase/frequency detector 120 receives timestamps based on clock signal CLKIN1 and feedback timestamps provided by time-to-digital converter 124 based on a feedback clock signal generated by frequency divider 126. The feedback clock signal may be based on a frequency-divided version of clock signal CLKVCO. Digital phase/frequency detector 120 provides a digital phase error signal reflecting the difference between clock signal CLKIN1 and the digital feedback clock signal. The frequency of clock signal CLKVCO is determined by the frequency of clock signal CLKIN1 and the divider value MR provided by digital loop filter 122 and provided to feedback divider 114 (e.g., a fractional divider) in the feedback path of inner digital phase-locked loop 104. Digital phase-locked loop 105 adjusts divider value MR to match the frequency of clock signal CLKVCO to a multiple of the frequency of clock signal CLKIN1 implemented using frequency divider 126 and frequency divider 116 (e.g., frequency(CLKIN1)=frequency(CLKVCO)/MA NB). The frequency of CLKOUT1 provided by frequency divider 112 is based on the frequency of clock signal CLKVCO and divider value NA.

Digital phase-locked loop 107 receives a clock signal CLKIN2 and configures output interpolative divider 128 as a digitally controlled oscillator to generate clock signal CLKOUT2 using clock signal CLKVCO as a low-jitter reference clock signal. Time-to-digital converter 130 receives input clock signal CLKIN2, which has a low frequency, e.g., 1 PPS or 1 PP2S. Clock signal CLKOUT2 has a frequency determined by the frequency of clock signal CLKIN2 and the divider value MB provided to frequency divider 138. Time-to-digital converter 136 provides feedback timestamps to digital phase/frequency detector 132. Digital loop filter 134 provides a digital control signal to output interpolative divider 128 based on the digital phase error signal reflecting the difference between clock signal CLKIN2 and the feedback clock signal. The digital control signal causes output interpolative divider 128 to match the frequency of clock signal CLKOUT2 to a multiple of the frequency of clock signal CLKIN2.

Figure 2:
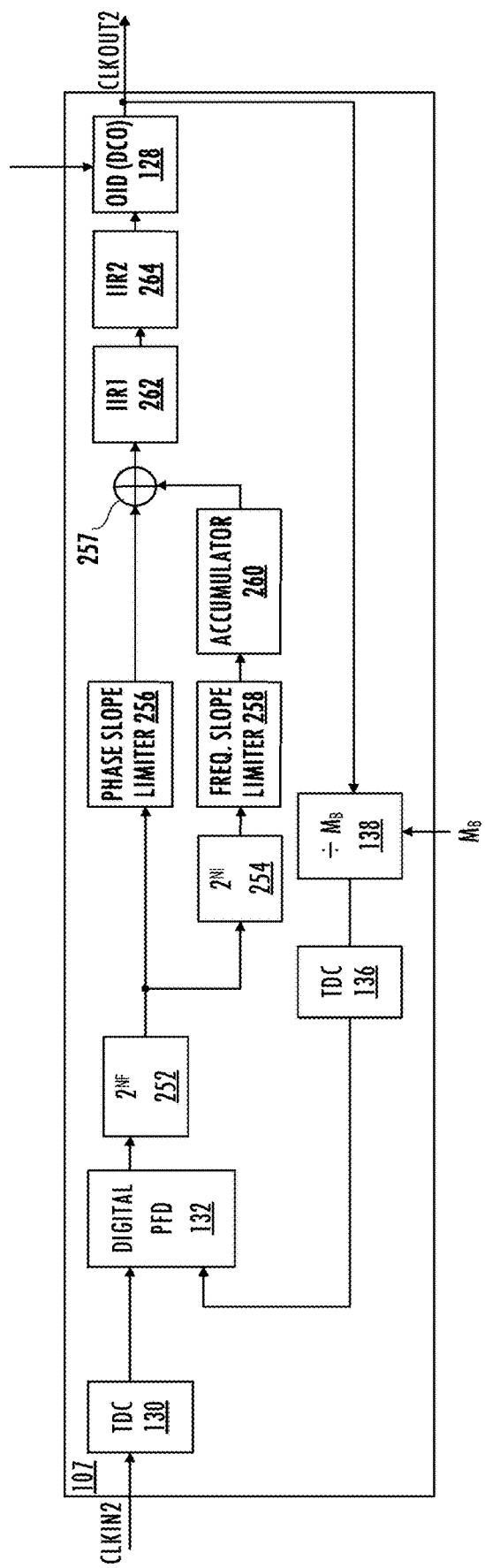
FIG. 2 illustrates a functional block diagram of a detailed portion of the digital phase-locked loop of FIG. 1.

FIG. 2 illustrates a detailed embodiment of digital phase-locked loop 107 implemented having a proportional-integral control loop filter structure and having a fixed loop gain. The loop gain is controlled by terms NI and NF, which are fixed. The output of digital phase/frequency detector 132 feeds a proportional path including forward gain 252 and phase slope limiter 256, and an integral path including integral gain 254, frequency slope limiter 258, and accumulator 260. Phase slope limiter 256 compares the gained phase difference signal to a predetermined phase slope limit. If the gained phase difference signal is less than the predetermined phase slope limit, phase slope limiter 256 provides the gained phase difference signal to summing circuit 257. If the gained phase difference signal is greater than the predetermined phase slope limit, phase slope limiter 256 provides the predetermined phase slope limit to summing circuit 257, thereby limiting the change in phase of the output clock signal CLKOUT2.

In a signal path that is coupled in parallel with phase slope limiter 256, integrator gain 254 applies another gain factor (e.g., a power of two) to the gained phase difference signal received from forward gain 252. If the gained phase difference value is greater than a predetermined frequency slope limit, then frequency slope limiter 258 provides a predetermined frequency slope limit to accumulator 260. If the gained phase difference value is less than the predetermined frequency slope limit, then frequency slope limiter 258 provides the gained phase difference signal to accumulator 260. In closed-loop operation, accumulator 260 sums values of the gained phase difference signal over time to obtain a frequency shift value and provides the combination with the output of phase slope limiter 256 to infinite impulse response filter 262 in series with infinite impulse response filter 264, which low-pass filter the phase-change limited and frequency-change limited output signal to generate a corresponding digital control signal for output interpolative divider 128. The conventional control loop of FIG. 2 is fixed and has a fixed locking time that depends on the quality of the input clock signal.

A technique for decreasing the lock or relock time of a digital phase-locked loop uses a modified control loop that has a variable control gain and thus, a variable locking time. The technique considers the quality of the input clock signal (e.g., uses a variance and covariance of a measurement of the input clock signal and process noise) to decrease the time to converge or lock to the target input clock signal. The technique maintains all the control loop characteristics like the acquiring and tracking modes of a conventional phase-locked loop. A dynamic model of a hardware-optimized structure includes a proportional-integral control loop having the same structure as a Kalman filter.

Figure 3:
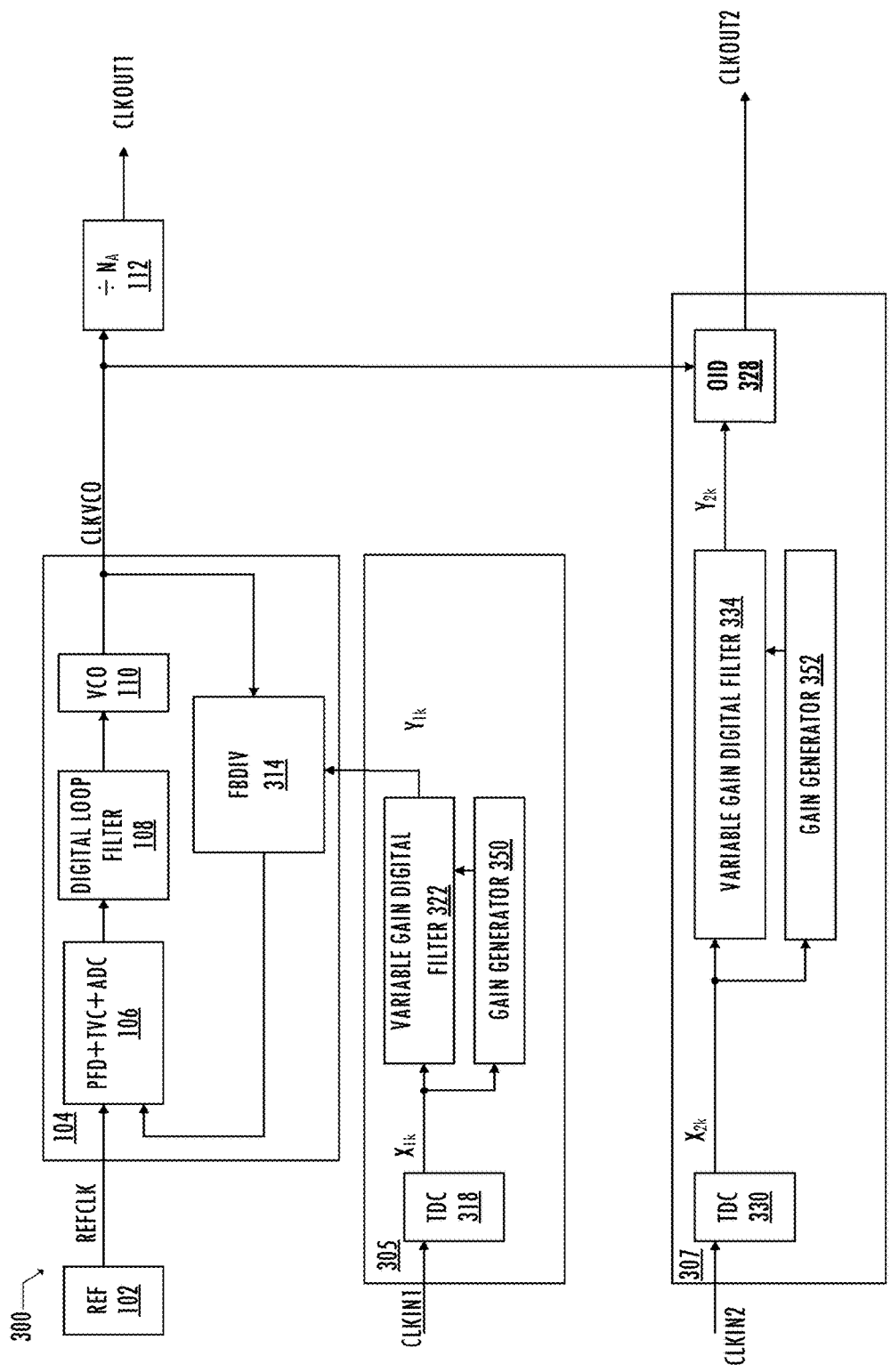
FIG. 3 illustrates a functional block diagram of a digital phase-locked loop implementing a modified control loop consistent with at least one embodiment of the invention.

Referring to FIG. 3, clock integrated circuit 300 includes digital phase-locked loop including a modified control loop 305 and digital phase-locked loop including a modified control loop 307, which include variable gain digital filter 322 and variable gain digital filter 334, respectively. Variable gain digital filter 322 and variable gain digital filter 334 receive updated loop gains based on input and process environments from gain generator 350 and gain generator 352, respectively, and provide output digital signal $Y_{1k}$ and output digital signal $Y_{2k}$, respectively, to a digitally controlled oscillator in feedback divider 314 and a digitally controlled oscillator in output interpolative divider 328, respectively. Each digitally controlled oscillator matches the phase and the frequency of the corresponding output signal to the phase and a multiple of the frequency of the corresponding input signal. In at least one embodiment, Variable gain digital filter 334 has variable loop gain K (e.g., proportional gain $K_{0f}$ and integral gain $K_{1f}$, where the proportional gain targets phase errors and the integral gain targets frequency errors) and the open loop equation for modified control loop 307 is as follows:

$$T_{k+1}(n) = T_k + F_0 + K_{0f}Z_{0k} + K_{1f}\left(\sum_{R=1}^{p} z_i\right),$$

where $Z_{0k}$ is the output of a phase detector or phase-frequency detector for the $k^{th}$ outputs of the corresponding time-to-digital converters, $z_i$ is the $i^{th}$ previous output of the phase detector for i=1 to P, $T_k$ and $T_{k+1}$ are the previous and the current control loop updates at the $k^{th}$ and k+1$^{th}$ edges of the output of the phase-frequency detector. The technique implements a modified control loop using a linear unbiased estimator (e.g., gain generator 352 or gain generator 350 that generates the loop gain coefficients for variable gain digital filter 334 or variable gain digital filter 322, respectively). The linear unbiased estimator minimizes the least mean square error and is the optimal estimator if the noise sources are Gaussian noise sources. An iterative mathematical process uses a set of equations and consecutive data points and quickly converges an estimate to a true value (e.g., in the locked state) when the measured values contain unpredicted or random error/variation. The linear unbiased estimator uses relatively few samples to converge as compared to a conventional digital phase-locked loop by using variation of the input clock signal.

In general, gain generator 352 estimates a parameter (e.g., phase or frequency) to minimize uncertainty about that parameter after altering the belief about the parameter based on a prior belief Gain generator 352 measures the parameter and then combines phase and frequency errors and the variance of the phase and frequency to provide a new gain that minimizes the uncertainty. The technique is based on Gaussian probability density functions that are fully described by their variances and covariances (e.g., stored in covariance matrix $P_k$, described above). Terms along a main diagonal of covariance matrix $P_k$ are the variances associated with the corresponding terms in the state vector. An appropriate mapping is used to move from one domain to another. Process noise and measurement noise are independent and thus, the covariance of the process noise and the measurement noise are ignored.

Figure 4:
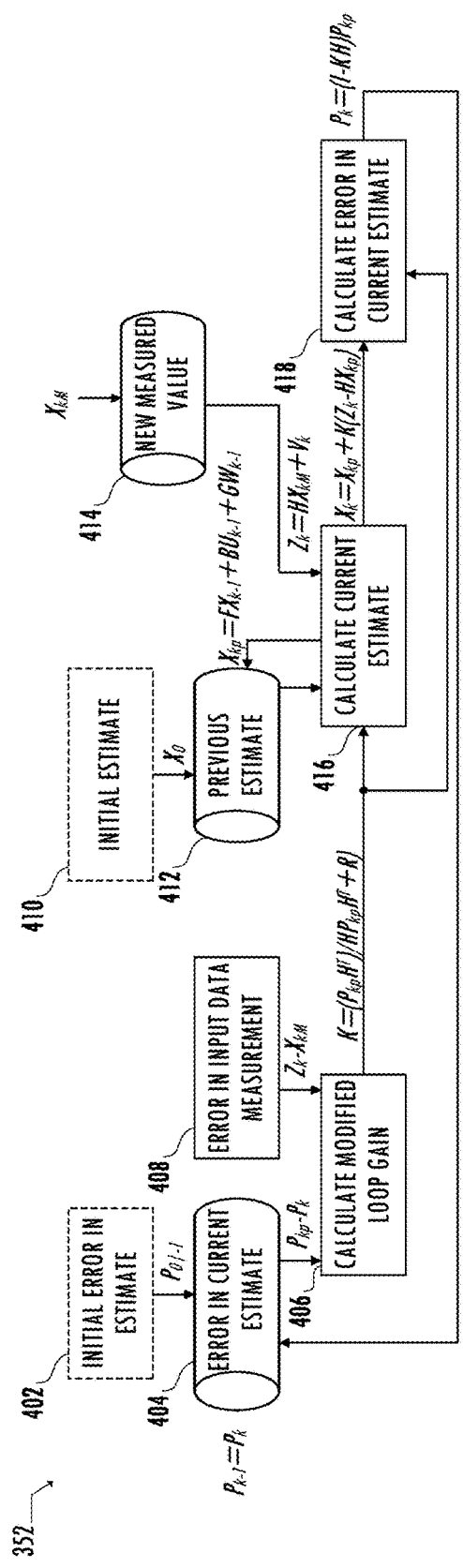
FIG. 4 illustrates an exemplary variable gain generation technique consistent with at least one embodiment of the invention.

Referring to FIGS. 3 and 4, in at least one embodiment, gain generator 352 calculates an error in input data measurement $Z_k$ (e.g., which indicates the variance of the phase and the frequency) (408) and an error in current estimate $X_k$ (418), which gain generator 334 stores for use in calculating a modified loop gain (404). Gain generator 352 calculates the modified loop gain based on the error in a current estimate and the error in an input data measurement (406). Gain generator 352 estimates the current signal value according to a previous estimation and a recent measurement (416). Gain generator 352 estimates the period clock skew and clock drift of input clock signal CLKIN2 (e.g., one PPS or one PP2S). Time-to-digital converter 330 converts the input clock signal into state $X_{1k}$ or state $X_{2k}$, respectively, which is a vector including phase $ph_k$ (in radians) of the corresponding input clock signal at any sampling instant k, and frequency $fr_k$ (radians per second) of the corresponding input clock signal. In at least one embodiment, gain generator 352 uses initial conditions, e.g., initial state vector $X_0$ including initial phase ($ph_0$) and initial frequency ($fr_0$) (410), and initial estimate error $P_{0|-1}$ including variance of the initial phase ($\sigma_\theta^2$) and normalized variance values of frequency offset ($\sigma_f^2$) (402) for faster convergence and faster locking. Gain generator 352 saves the current estimate as the previous estimate (412) and receives a current state $X_k$ every clock cycle from a time-to-digital converter and stores a new measured value $Z_k$ based on that current state $X_k$ (414). Similar description applies to gain generator 350.

The iterative process for gain generator 352 or gain generator 350 is further described as follows:

$$X_0 = \begin{bmatrix} ph_0 \\ fr_0 \end{bmatrix} \text{ and } P_{0|-1} = \begin{bmatrix} \sigma_\theta^2 & 0 \\ 0 & \sigma_f^2 \end{bmatrix}. \qquad 1$$

Figure 5:
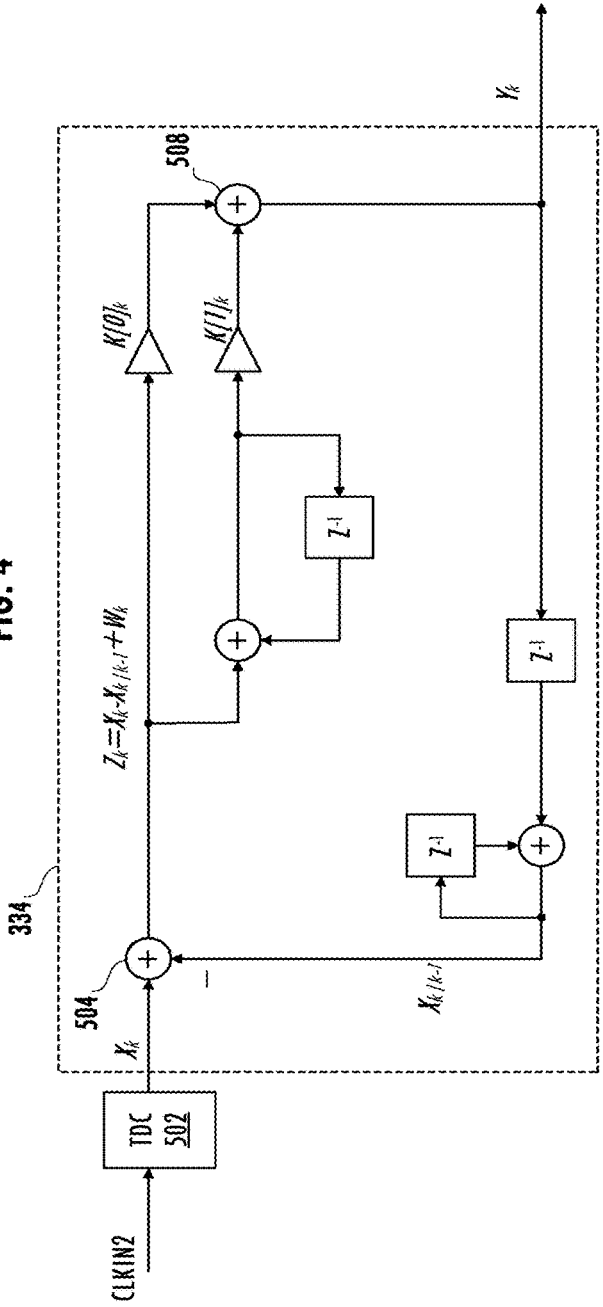
FIG. 5 illustrates a functional block diagram of a detailed portion of the modified control loop of the digital phase-locked loop of FIG. 3 consistent with at least one embodiment of the invention.

Gain generator 352 iteratively updates estimated (i.e., predicted) values $X_{kp}$ and corrects measurements $Z_k$ to determine loop gain coefficients K:

$$X_{kp} = F\ X_{k-1} + BU_{k-1} + G\ W_{k-1}; \qquad 2$$

$$P_{kp} = FP_{k-1}F^T + Q_k; \qquad 3$$

$$K = \frac{P_{kp}H^T}{HP_{kp}H^T + R}; \qquad 4$$

$$Z_k = HX_{kM} + V_k; \qquad 5$$

$$X_k = X_{kp} + K(Z_k - HX_{kp}); \qquad 6$$

$$P_k = (I - KH)P_{kp}; \qquad 7$$

$$X_{k-1} = X_k; \text{ and} \qquad 8$$

$$P_{k-1} = P_k, \qquad 9$$

where $X_k$ is the state vector, i.e., the output of the calculated current estimate of the phase and frequency;

$X_{kp}$ is the previous estimated state vector for phase and frequency;

$Z_k$ is the measurement or observation;

$X_{kM}$ is the observed state of phase and frequency at that $k^{th}$ instant;

$X_{k-1}$ is $X_k$ and will become the $X_{kp}$ in the next iteration or updates of the equations;

F is the input/estimate state deviation transition matrix;

B is the control-input model applied to the control vector $U_k$;

$W_k$ is the noise matrix including process noise terms for each parameter in the state vector (e.g., representing a zero mean white phase jitter and timing offset jitter); in an embodiment, the process noise is assumed to be drawn from a zero mean multivariate normal distribution with covariance given by the covariance matrix $Q_k$;

$U_k$ is the input control vector that defines the correction of the clock skew and clock offset;

G is a matrix describing the noise affecting the process;

Q is the process noise covariance matrix which are the clock skew and clock offset variance;

H is a transformation matrix, e.g., $$H = \begin{bmatrix} 1 & 0 \\ 0 & 1 \end{bmatrix}$$

for an embodiment illustrated in FIGS. 3, 4, and 5;

$V_k$ is a vector including measurement noise terms for each observation in the measurement vector. In an embodiment, like the process noise, the measurement noise is assumed to be zero mean Gaussian white noise with covariance R;

$P_k$ is the estimation error (e.g., the estimate covariance matrix of the error in the estimated phase and frequency of the input clock signal); and R is the covariance matrix of the observation noise.

If noise affecting frequency and phase is already captured by the covariance matrix and R vector observation noise, then $$X_k = \begin{bmatrix} ph_k \\ fr_k \end{bmatrix}, F = \begin{bmatrix} 1 & 1 \\ 0 & 1 \end{bmatrix}, B = \begin{bmatrix} -1 & -1 \\ 0 & -1 \end{bmatrix}, U_k = 0; \text{ and } G = \begin{bmatrix} 0 \\ 0 \end{bmatrix},$$

where $U_k$ is a deterministic term and in the stochastic state estimation t is deterministic part of the input can be eliminated with loss of generality.

$$H = \begin{bmatrix} 1 & 0 \\ 0 & 1 \end{bmatrix}, Z_{k-} = \begin{bmatrix} ph_i \\ fr_i \end{bmatrix}, V_k = 0;$$

$$P_{kp} = E\left((X_{k|k} - X_{k|k-1})^2\right) = \begin{bmatrix} \sigma_{\theta+f}^2 & 0 \\ 0 & \sigma_f^2 \end{bmatrix};$$

$$K = \frac{\begin{bmatrix} \sigma_{\theta+f}^2 & 0 \\ 0 & \sigma_f^2 \end{bmatrix} \begin{bmatrix} 1 & 0 \\ 0 & 1 \end{bmatrix}}{\begin{bmatrix} 1 & 0 \\ 0 & 1 \end{bmatrix} \begin{bmatrix} \sigma_{\theta+f}^2 & 0 \\ 0 & \sigma_f^2 \end{bmatrix} \begin{bmatrix} 1 & 0 \\ 0 & 1 \end{bmatrix} + \begin{bmatrix} \Delta_{errphase} & 0 \\ 0 & \Delta_{errfreq} \end{bmatrix}} =$$

$$\begin{bmatrix} \dfrac{\sigma_{\theta+f}^2}{\sigma_{\theta+f}^2 + \Delta_{errphase}} & 0 \\ 0 & \dfrac{\sigma_f^2}{\sigma_f^2 + \Delta_{errfreq}} \end{bmatrix}; \text{ and}$$

$$P_{k|k-1} = (I - KH)P_{kp}.$$

The variable loop gain K is a vector of weighting factors that are based on comparing the estimate error (i.e., the error in the estimate) to the measurement error (i.e., the error in the measurement). For example, if the measured value has relatively small error, then a weight applied to the measured value is greater than a weight applied to the estimated value and if the measured value has a relatively large error, then a weight applied to the estimated value is greater than a weight applied to the measured value. The gain and the prediction covariance matrix will reach a steady state value in some amount of time. In an embodiment, the proportional path is predominately relevant to phase and the integral path is predominately relevant to frequency. Based on the optimized or simplified (i.e., ignoring constant gains) the variable loop gain is as follows:

$$K = \begin{bmatrix} \dfrac{\sigma_{\theta+f}^2}{\sigma_{\theta+f}^2 + \Delta_{errphase}} & 0 \\ 0 & \dfrac{\sigma_f^2}{\sigma_f^2 + \Delta_{errfreq}} \end{bmatrix},$$

where K[1,1] applies to the proportional path and K[2,2] applies to the integral path.

FIG. 5 illustrates an embodiment of variable gain digital filter 334 or variable gain digital filter 322, which have a structure like the structure of a conventional PI controller. Time-to-digital converter 502 measures input clock signal CLKIN2 and provides state vector $X_k$ to summing circuit 504, which combines state vector $X_k$ with a feedback value of posteriori estimate $X_{k|k-1}$ to generate measured value $Z_k$. Summing circuit 504 provides measured value $Z_k$ to the proportional path and to the integral path of variable gain digital filter 334. In at least one embodiment, the output of summing circuit is $K_{0f}Z_{0k}+K_{1f}(\Sigma_{R=1}^{P}z_i)$. In at least one embodiment of variable gain digital filter 334 has variable loop gain K (e.g., coefficients $K[0]_f$ for the proportional path and $K[1]_f$ for the integral path). Summing circuit 508 combines the gained outputs of the proportional path and the integral path to generate digital output $Y_k$, which reflects an error in the input clock signal and is a digital code that updates a digitally controlled oscillator in the forward path to adjust the output clock signal and also provides feedback to the control loop that corrects for phase and frequency errors.

This technique has two primary sources of error: initialization error and stochastic errors due to the process and measurement noise. In early stages of operation, initialization error dominates, and it takes some time for the estimated state to converge to the true state from an incorrect initial state. After initial error convergence, measurement noise remains, resulting in persistent errors. Stability analysis can be used to generate an initial error and noise disturbance. Below are few assumptions to analyze the convergence rate of the control loop. If the following assumptions hold, then:

the assumed initial covariance is bounded as $$X_0^T P_0^{-1} X_0 \leq v_0 \|X_0\|^2;$$

the state error covariance matrix is bounded by the following inequality for all k $$X_k^T P_k^{-1} X_k \geq b_k \|X_k\|^2; \text{ and}$$

the assumed process and measurement noise covariance matrices are conservative, $$Q_{k-1} \geq E(W_{k-1}) \text{ and } R_k \geq E(V_k).$$

Where $X_k$ state error (estimation error) at K, $\|.\|^2$ is the Euclidean norm and for some constants $v_0$ and $b_k$, then the expected value of the estimation error is bounded in mean square with probability one by $$E[\|X_k\|^2] \leq \frac{v_0}{b_k}[\|X_0\|^2]\prod_{i=0}^{k-1}(1-\alpha_i) + \frac{1}{b_k}\sum_{i=0}^{k-1}\left[\mu_{k-i-1}\prod_{j=1}^{i}1-\alpha_{k-j}\right],$$

where $\alpha$ is the convergence rate given as $$\alpha_{k-1} = \lambda_{min}[(P_{k|k-1} + P_{k|k-1}HR^{-1}HP_{k|k-1})^{-1} * (Q_{k-1} + P_{k|k-1}HR^{-1}HP_{k|k-1})].$$

Parameter $\mu_k$ corresponds to the persistent error bound on the timing loop due to process and measurement noise:

$$\mu_{k-1} = \text{Trace}[(P_{k|k-1} + P_{k|k-1}HR^{-1}HP_{k|k-1})^{-1} * (Q_{k-1} + P_{k|k-1}HR^{-1}HP_{k|k-1})].$$

Parameter $b_k$ represents convergence of error covariance:

$$b_k = \lambda_{min}(P_k^{-1}),$$

where $\lambda_{min}$ is the minimum eigen value of the matrix. Where Q and R are constant, the estimation error covariance $P_k$ and loop gain K stabilize quickly and then remain constant. The improvement in acquisition performance resulting from the modified control loop of a digital phase-locked loop described above is illustrated in FIGS. 6A-10B.

Figure 6A:
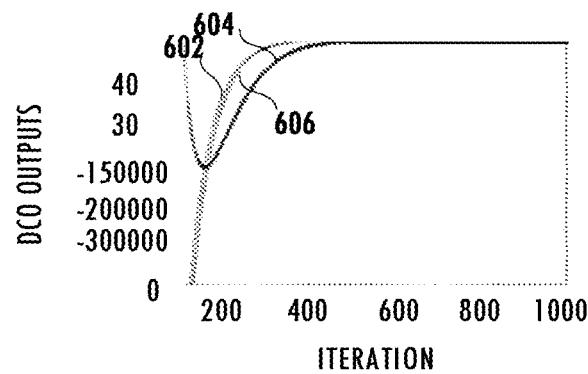
FIG. 6A illustrates an exemplary response as a function of iteration of a conventional digital phase-locked loop and a digital phase-locked loop including a modified control loop consistent with at least one embodiment of the invention.
Figure 6B:
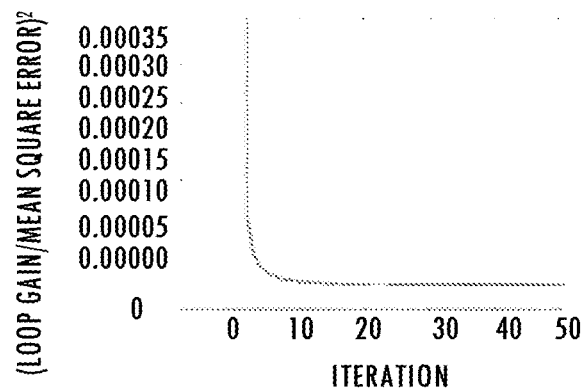
FIG. 6B illustrates estimated a priori error of a modified control loop of a digital phase-locked loop consistent with at least one embodiment of the invention.
Figure 7A:
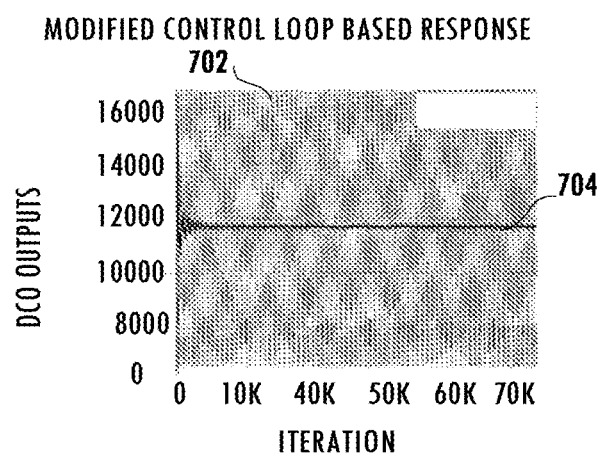
FIG. 7A illustrates a response of a jitter-attenuated mode of a modified control loop of a digital phase-locked loop consistent with at least one embodiment of the invention.
Figure 7B:
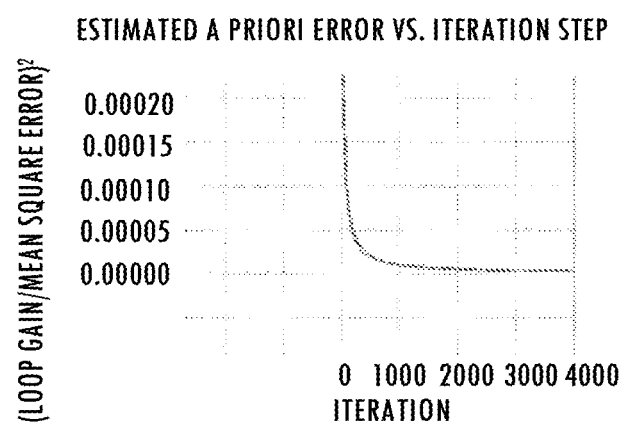
FIG. 7B illustrates the convergence rate of error to a minimum error of a modified control loop in a digital phase-locked loop consistent with at least one embodiment of the invention.
Figure 8A:
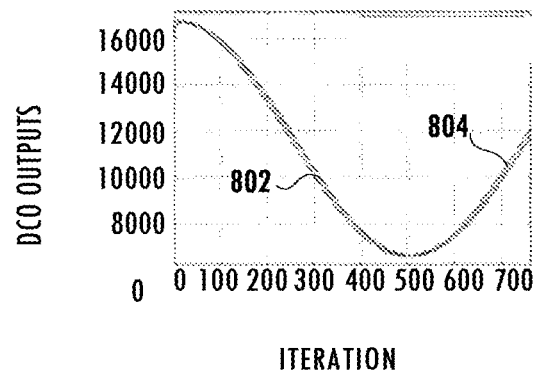
FIG. 8A illustrates a response in signal tracking mode of a modified control loop of a digital phase-locked loop consistent with at least one embodiment of the invention.
Figure 8B:
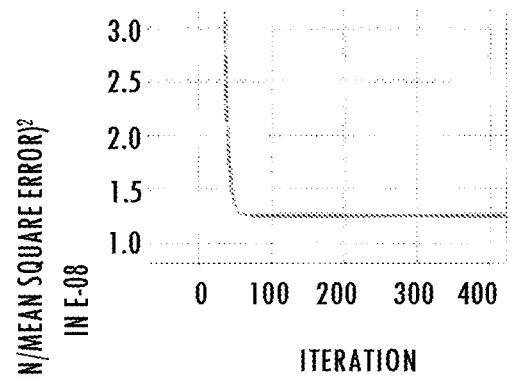
FIG. 8B illustrates the convergence rate of error to a minimum error of a modified control loop in a digital phase-locked loop of the modified control loop of a digital phase-locked loop consistent with at least one embodiment of the invention.

FIG. 6A illustrates a comparison of the response of a conventional digital phase-locked loop to the response of a digital phase-locked loop including the modified control loop described above. The DCO output 606 generated using the modified control loop converges faster than DCO output 604 generated using a conventional digital phase-locked loop in response to digital input 602, which is the output of a corresponding time-to-digital converter. FIG. 6B illustrates convergence of estimated a priori error as a function of iterations for the digital phase-locked loop including the modified control loop described above. FIG. 7A illustrates the variable gain filter output 704 in response to input to the variable gain filter input 702 for an exemplary jitter-attenuated mode of the digital phase-locked loop including the modified control loop described above. FIG. 7B illustrates a corresponding convergence of estimated a priori error as a function of iterations for the digital phase-locked loop including the modified control loop described above. FIG. 8A illustrates the variable gain filter output 804 in response to input to the variable gain filter input 802 for an exemplary jitter-attenuated mode of the digital phase-locked loop including the modified control loop described above in a signal tracking mode. FIG. 8B illustrates a corresponding convergence of estimated a priori error as a function of iterations for the digital phase-locked loop including the modified control loop described above.

Figure 9A:
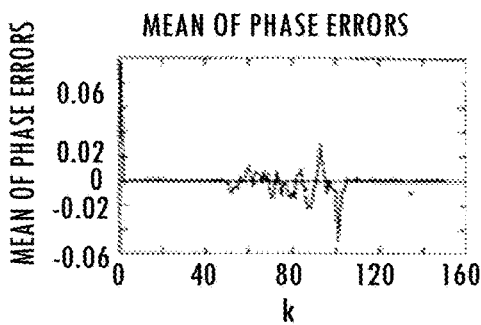
FIG. 9A illustrates performance of a signal-acquiring mode of the modified control loop of a digital phase-locked loop consistent with at least one embodiment of the invention.
Figure 9B:
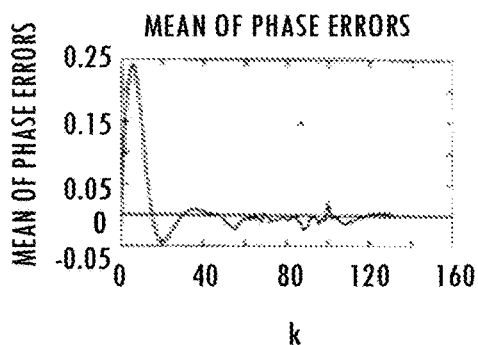
FIG. 9B illustrates performance of a signal-acquiring mode of a conventional digital phase-locked loop consistent with at least one embodiment of the invention.
Figure 10A:
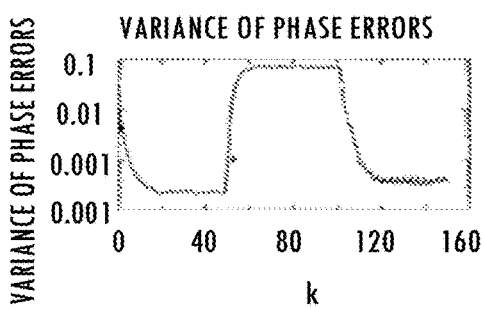
FIG. 10A illustrates performance of a signal-acquiring mode of the modified control loop of a digital phase-locked loop consistent with at least one embodiment of the invention.
Figure 10B:
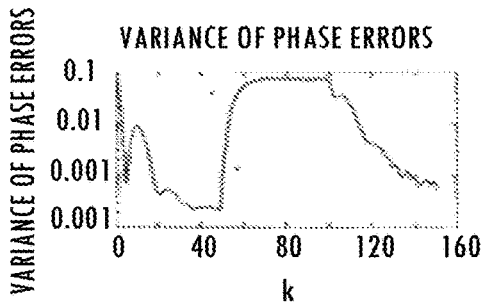
FIG. 10B illustrates performance of a signal-acquiring mode of the conventional digital phase-locked loop consistent with at least one embodiment of the invention.

FIG. 9A illustrates mean of phase error in an exemplary signal-acquiring mode of a digital phase-locked loop including the modified control loop described above. FIG. 9B illustrates mean of phase error in a signal-acquiring mode of a conventional digital phase-locked loop, which has a degraded acquisition time as compared to the mean of the phase error generated by a digital phase-locked loop including the modified control loop described above. FIG. 10A illustrates variance of phase error in an exemplary signal-acquiring mode of the digital phase-locked loop including the modified control loop described above. FIG. 10B illustrates a variance of phase error in a signal acquiring mode of the conventional digital phase-locked loop which has degraded performance as compared to the digital phase-locked loop including the modified control loop described above.

Figure 11:
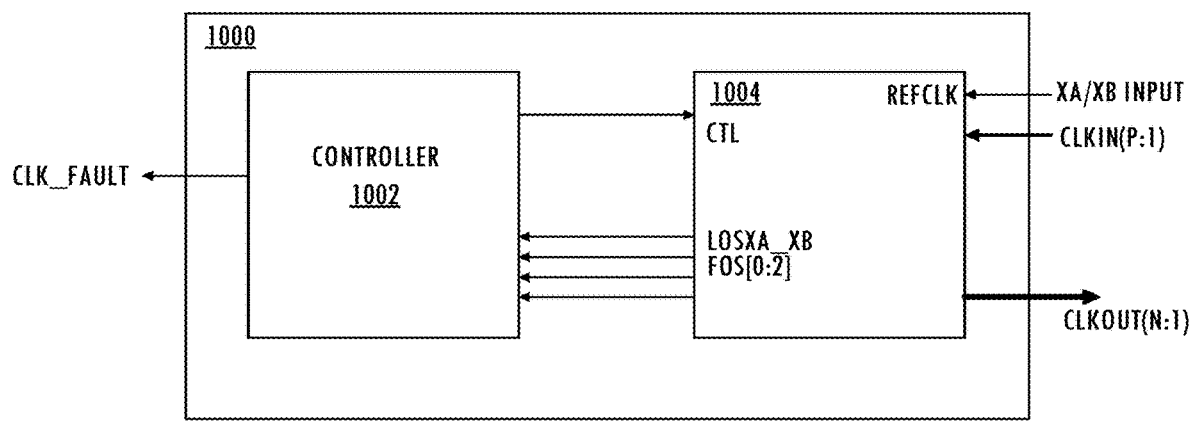
FIG. 11 illustrates a functional block diagram of an exemplary clock product including digital phase-locked loop implementing a modified control loop consistent with at least one embodiment of the invention.

The techniques described above can be used in tracking systems, artificial intelligence-related applications and systems requiring synchronization. The control loops described above can be used as an alternative to conventional PI controller control loop systems. FIG. 11 illustrates an embodiment of a clock product that includes a digital phase-locked loop using a variable gain digital filter described above. Clock product 1000 includes controller 1002 and clock generator 1004, which monitors at least one received clock signal (e.g., CLKIN(P:1)) using clock signal REFCLK (e.g., a clock signal generated using a crystal oscillator including an external crystal coupled to XA/XB input terminal) and provides at least one output clock signal CLKOUT(N:1) and at least one clock quality signal, where P and N are integers greater than zero. In an embodiment of clock product 1000, clock signal REFCLK is generated based on a stable source such as crystal oscillator, a microelectromechanical structure (MEMS) oscillator, or other suitable low-jitter source. Controller 1002 provides configuration information to clock generator 1004 using interface signals CTL. Clock generator 1004 provides clock quality information (e.g., LOSXA_XB or CLK_STATUS) to controller 1002, which outputs one or more alarm signals (e.g., CLK FAULT) based on the clock quality information.

In at least one embodiment, the digital phase-locked loop implementing variable gain digital filter techniques described above is included in a network communication box that uses timing protocols to ensure time of day (ToD) counters in the network are synchronized. SYNC signals are used to update time of day counters at the same time in the network. Any delay/offset and process, voltage, temperature (PVT) variation between the SYNC lines being supplied to the ToD counters in each line card in the network box results in an error that is classified as Continuous Time Error (CTE). Network communications are used to communicate various status and information regarding the system.

Figure 12:
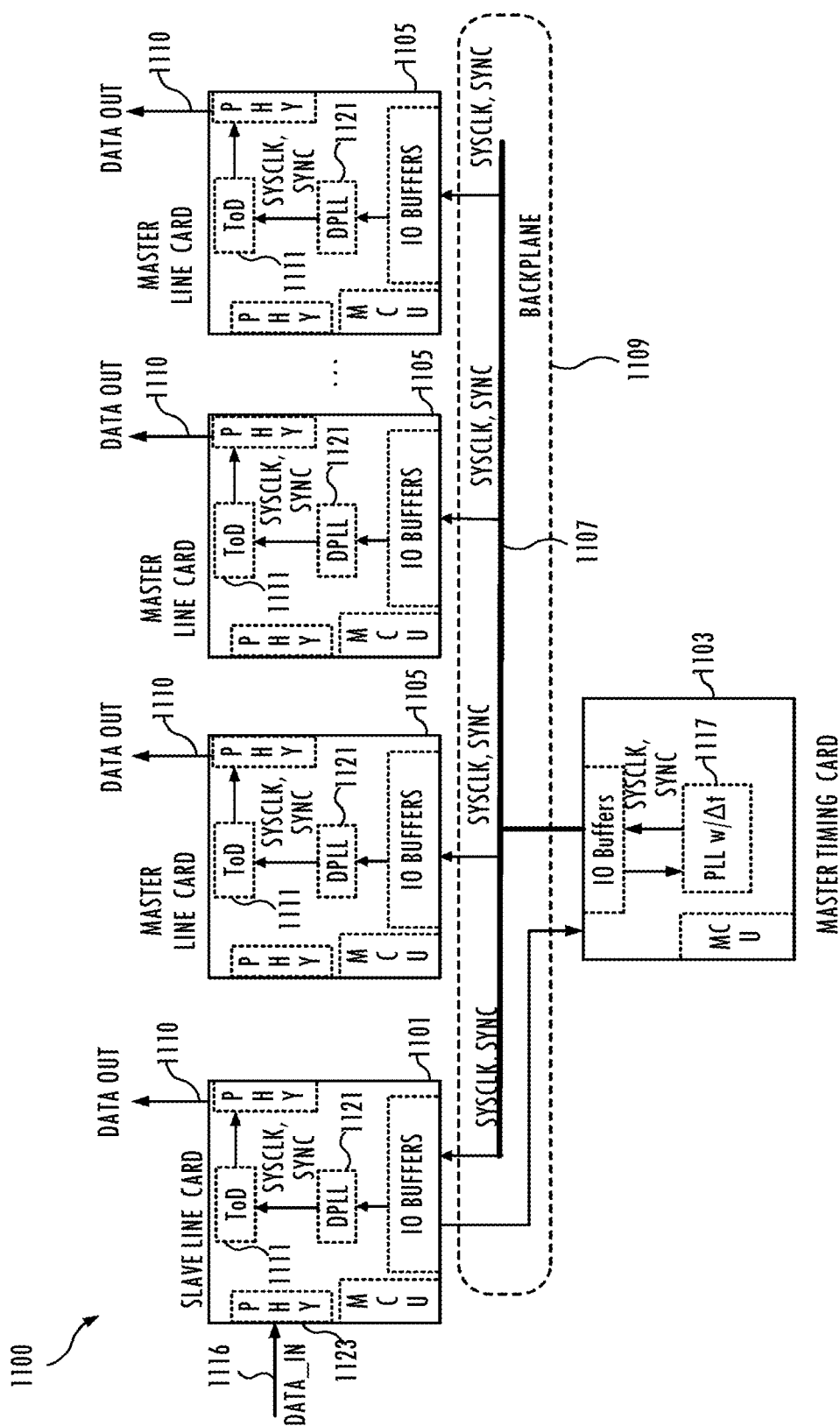
FIG. 12 illustrates a typical communication network system with a slave line card (LC), a master timing card (TC), and multiple master line cards coupled through a backplane and including embodiments of a digital phase-locked loop including a modified control loop consistent with at least one embodiment of the invention.

FIG. 12 shows a typical architecture of a communication network system. Communication network system includes a slave line card (LC) 1101, a master timing card (TC) 1103, and multiple master line cards 1105. The DATA OUT 1110 from each line card is time stamped using time stamps from local Time of Day (ToD) counters 1111. The master timing card 1103 generates a SYNC signal and system clock signal (SYSCLK) using DPLL 1117 and dividers (not shown). The SYNC signal is also referred to as the FSYNC (frame sync) signal in certain contexts since the signal has different names (SYNC or FSYNC) at the system level or integrated circuit level inside the network box. The signal will be referred to as the SYNC signal herein for ease of reference. Master timing card 1103 supplies the SYSCLK and SYNC signal (shown as signals 1107) to slave line card 1101 and master line cards 1105 over backplane 1109. The SYNC signal is a global signal inside the network system box 1100 that signifies the right moment/edge for the Time of Day (ToD) counters 1111 to rollover. The SYNC signal typically has a frequency range of 8 kHz to PP2S (pulse per 2 seconds). In many network systems the SYNC signal is a 1 pulse per second (1PPS) signal. SYNC is an integer divided down and edge-aligned version of system clock signal SYSCLK. The various ToD counters 1111 contain the same value and turnover at the same time based on the SYNC signal. Each of the slave line card 1101 and master line cards 1105 generate the local SYNC signal by dividing system clock signal SYSCLK generated by DPLL 1121 in a divider (not shown in FIG. 11) to the target frequency.

The exact position of the SYNC edge is derived using a precision time protocol (PTP) servo loop that uses time information inside the incoming Synchronous Ethernet (SyncE) packet stream to slave line card 1101 on input DATA_IN 1116 of physical interface 1123. The timestamps exchange allows determination of one-way delay (OWD) and error offset between the upstream PHY and the downstream PHY. That time stamp exchange allows the slave line card to determine the correct time provided by the upstream PHY even with delays between the upstream PHY and the downstream PHY. Note that the high-level description of the PTP servo loop is provided as background information to provide context in which various embodiments of the digital phase-locked loop described herein can be utilized.

Slave line card 1101 and master timing card 1103 also have a closed loop PTP servo system in accordance with the IEEE 1588 protocol that corrects the position of the SYNC signal over process, voltage, and temperature (PVT) and aligns the SYNC signals distributed by the master timing card 1103 to the timing of the incoming packet stream to the slave line card. The servo loop ensures that the slave line card and the master timing card are synchronized. The slave line card 1101 and the master timing card 1103 exchange information in the closed loop system to adjust the CLK and SYNC pair on the master timing card such that the slave line card ToD is aligned with the network ToD of the chosen incoming data stream on DATA_IN 1116. The PTP servo loop adjusts the timing of SYNC by adjusting DPLL 1117 so that the slave line card ToD is aligned in frequency and phase to the upstream ToD received by the slave line card on input DATA_IN 1116. The distributed system clock signal SYSCLK is distributed and supplied as a reference clock to DPLL 1121 within each of the line cards and the line card digital phase-locked loops generate a local system clock signal SYSCLK and SYNC signal that is phase and frequency aligned with the distributed system clock signal SYSCLK and SYNC signal. The master line cards 1105 are duplicates (up to 64 copies) of the slave line card 1101 but without the closed loop PTP servo loop. In other words, the distribution of the CLK/SYNC pair to the master line cards 1105 is open loop (i.e., without the PTP closed loop adjustments). The timing card and various line cards communicate, at least in part, utilizing a serial communication bus (not shown in FIG. 11) to transmit various status and configuration information. Use of the digital phase-locked loop including linear prediction to suppress spurs described above reduces errors and improves the performance of system 1100.

Structures described herein may be implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium.

Thus, techniques for reducing the lock time or relock time of a digital phase-locked loop are described. The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and does not otherwise indicate or imply any order in time, location or quality. For example, "a first signal," and "a second signal," does not indicate or imply that the first signal occurs in time before the second signal. Variations and modifications of the embodiments disclosed herein may be made based on the description set forth herein, without departing from the scope of the invention as set forth in the following claims.

What is claimed is:

1. A method for generating a clock signal using a digital phase-locked loop, the method comprising:
    calculating an estimate error of a current estimate of a phase and a frequency of an input clock signal and a measurement error of a measurement of the phase and the frequency of the input clock signal; and
    updating a gain of a variable gain digital filter of the digital phase-locked loop using the estimate error.

2. The method as recited in claim 1 wherein the gain includes a proportional gain component and an integral gain component.

3. The method as recited in claim 1 further comprising calculating the current estimate of the phase and the frequency of the input clock signal based on a previous estimate of the phase and the frequency of the input clock signal, the measurement of the phase and the frequency of the input clock signal, and the gain of the variable gain digital filter.

4. The method as recited in claim 3 further comprising calculating the estimate error based on the gain of the variable gain digital filter and the current estimate of the phase and the frequency of the input clock signal.

5. The method as recited in claim 3 wherein the previous estimate is based on an initial condition of the phase and the frequency of the input clock signal.

6. The method as recited in claim 1 wherein the estimate error is a covariance based on the measurement and the current estimate.

7. The method as recited in claim 1 wherein the estimate error is based on a variance of an initial phase and a normalized variance of an offset of the frequency of the input clock signal.

8. A digital phase-locked loop comprising:
    a time-to-digital converter configured to generate a digital signal based on an input clock signal, the digital phase-locked loop being configured to generate a phase-adjusted clock signal based on the digital signal;
    a variable gain digital filter configured to apply a time-varying gain to the digital signal; and
    a variable gain generator configured to use the digital signal to update the time-varying gain based on an estimate error of a current estimate of a phase and a frequency of the input clock signal and a measurement error of a measurement of the phase and the frequency of the input clock signal.

9. The digital phase-locked loop as recited in claim 8 wherein the variable gain digital filter includes a proportional signal path and an integral signal path and the time-varying gain includes a proportional gain component and an integral gain component.

10. The digital phase-locked loop as recited in claim 8 wherein the variable gain generator is configured to generate the current estimate of the phase and the frequency of the input clock signal based on a previous estimate of the phase and the frequency of the input clock signal, the measurement of the phase and the frequency of the input clock signal, and the time-varying gain of the variable gain digital filter.

11. The digital phase-locked loop as recited in claim 10 wherein the variable gain generator is configured to calculate the estimate error based on the time-varying gain of the variable gain digital filter and the current estimate of the phase and the frequency of the input clock signal.

12. The digital phase-locked loop as recited in claim 10 wherein the previous estimate is based on an initial condition of the phase and the frequency of the input clock signal.

13. The digital phase-locked loop as recited in claim 8 wherein the estimate error is a covariance based on the measurement and the current estimate.

14. The digital phase-locked loop as recited in claim 8 wherein the variable gain generator updates the time-varying gain every cycle of the input clock signal.

15. The digital phase-locked loop as recited in claim 8 wherein the variable gain generator comprises a storage element and a processor configured to execute instructions stored in the storage element, the instructions being executable by the processor to cause the processor to compute the time-varying gain.

16. The digital phase-locked loop as recited in claim 8 further comprising the variable gain digital filter including a proportional signal path having a first variable gain and an integral signal path having a second variable gain.

17. A method for generating a clock signal using a digital phase-locked loop, the method comprising:
    filtering a state of a phase and a frequency of an input clock signal using a variable gain digital filter having a gain updated based on the state of the phase and the frequency of the input clock signal and a measurement of the phase and the frequency of the input clock signal; and
    providing an output of the variable gain digital filter to a feedback divider of the digital phase-locked loop.

18. The method as recited in claim 17 wherein the gain includes a proportional gain component and an integral gain component.

19. The method as recited in claim 17 wherein the gain is updated every cycle of the input clock signal.

* * * * *